United States Patent [19]
McClintock et al.

[11] Patent Number: 5,543,732
[45] Date of Patent: Aug. 6, 1996

[54] PROGRAMMABLE LOGIC ARRAY DEVICES WITH INTERCONNECT LINES OF VARIOUS LENGTHS

[75] Inventors: Cameron McClintock, Mountain View; William Leong, San Francisco; Richard G. Cliff, Milpitas; Bahram Ahanin, Cupertino, all of Calif.

[73] Assignee: Altera Corporation, San Jose, Calif.

[21] Appl. No.: 442,832

[22] Filed: May 17, 1995

[51] Int. Cl.⁶ .................................. H03R 19/173
[52] U.S. Cl. ...................... 326/41; 326/39; 326/47
[58] Field of Search ................. 326/38, 39, 41, 326/47

[56] References Cited

U.S. PATENT DOCUMENTS

| | | | |
|---|---|---|---|
| Re. 34,363 | 8/1993 | Freeman | 307/465 |
| 3,473,160 | 10/1969 | Wahlstrom | 340/172.5 |
| 4,609,986 | 9/1986 | Hartmann et al. | 364/200 |
| 4,617,479 | 10/1986 | Hartmann et al. | 307/465 |
| 4,642,487 | 2/1987 | Carter | 307/465 |
| 4,677,318 | 6/1987 | Veenstra | 307/465 |
| 4,713,792 | 12/1987 | Hartmann et al. | 364/900 |
| 4,758,745 | 7/1988 | Elgamal et al. | 307/465 |
| 4,774,421 | 9/1988 | Hartmann et al. | 307/465 |
| 4,871,930 | 10/1989 | Wong et al. | 307/465 |
| 4,899,067 | 2/1990 | So et al. | 307/465 |
| 4,912,342 | 3/1990 | Wong et al. | 307/465 |
| 5,073,729 | 12/1991 | Greene | 326/47 |
| 5,121,006 | 6/1992 | Pedersen | 307/465 |
| 5,208,491 | 5/1993 | Ebeling | 326/39 |
| 5,218,240 | 6/1993 | Camarota | 326/41 |
| 5,220,214 | 6/1993 | Pedersen | 307/465 |
| 5,255,203 | 10/1993 | Agrawal | 326/41 |
| 5,260,610 | 11/1993 | Pederson | 326/41 |
| 5,260,611 | 11/1993 | Cliff | 326/39 |
| 5,350,954 | 9/1994 | Patel | 307/465 |
| 5,371,422 | 12/1994 | Patel et al. | 326/41 |
| 5,467,029 | 11/1995 | Taffe | 326/41 |

OTHER PUBLICATIONS

R. C. Minnick, "A Survey of Microcellular Research," Journal of the Association for Computing Machinery, vol. 14, No. 2, pp. 203–241, Apr. 1967.

S. E. Wahlstrom, "Programmable Logic Arrays—Cheaper by the Millions," Electronics, Dec. 11, 1967, pp. 90–95.

*Recent Developments in Switching Theory*, A. Mukhopadhyay, ed., Academic Press, New York, 1971, chapters VI and IX, pp. 229–254 and 369–422.

El Gamal et al., "An Architecture for Electrically Configurable Gate Arrays," IEEE Journal of Solid–State Circuits, vol. 24, No. 2, Apr. 1989, pp. 394–398.

El-Ayat et al., "A CMOS Electrically Configurable Gate Array," IEEE Journal of Solid–State Circuits, vol. 24, No. 3, Jun. 1989, pp. 752–762.

"XC5000 Logic Cell Array Family, Technical Data, Advance Information," Xilinx, Inc., Feb. 1995.

*Primary Examiner*—Edward P. Westin
*Assistant Examiner*—Andrew Sanders
*Attorney, Agent, or Firm*—Fish & Neave; Robert R. Jackson

[57] ABSTRACT

A programmable logic array device has a plurality of logic regions and conductors for conveying signals between the logic regions. Conductors of several different lengths are provided so that most connections between logic regions can be made using conductors which are close to the length required and not wastefully much longer than that length.

26 Claims, 7 Drawing Sheets

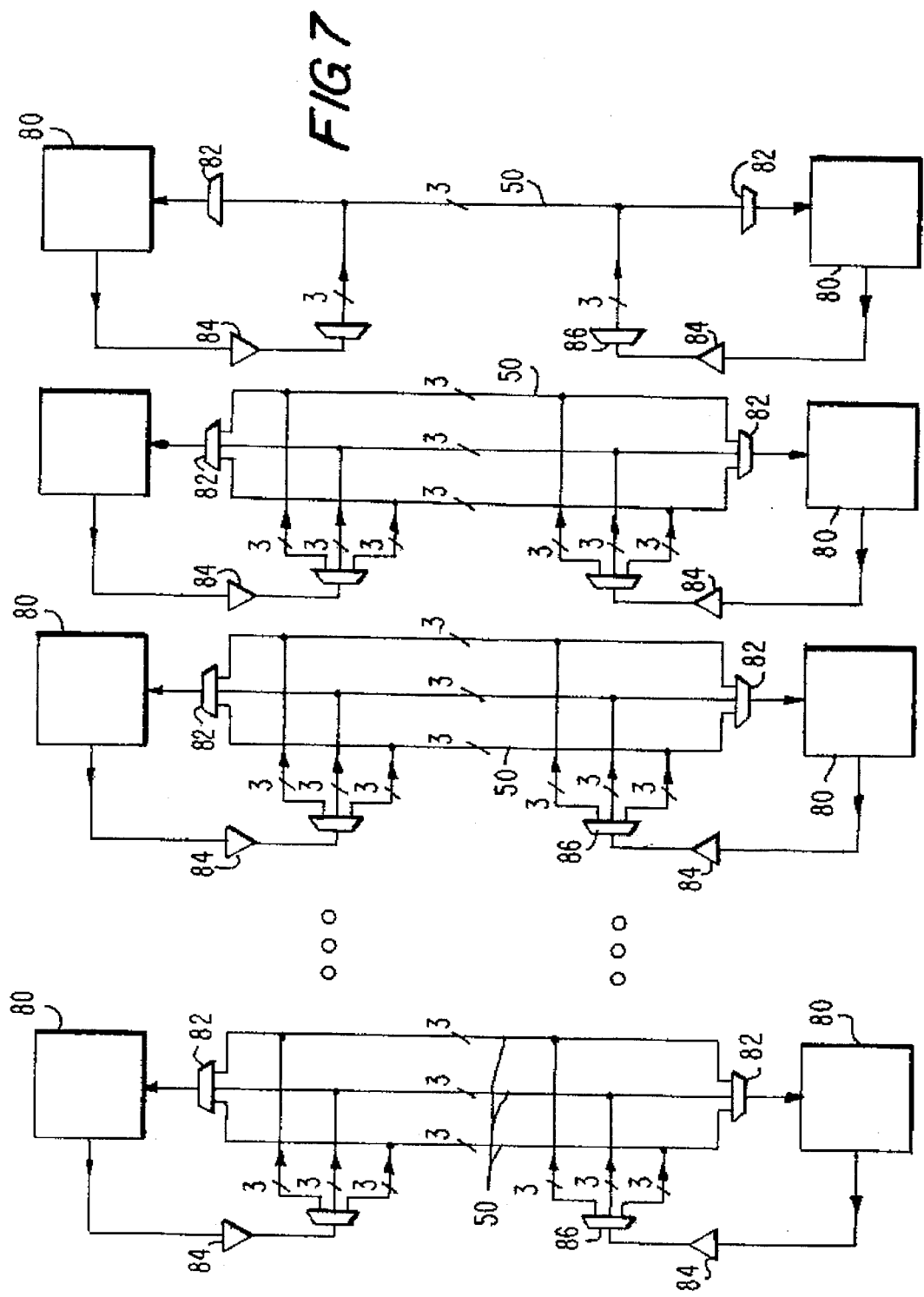

PROGRAMMABLE LOGIC ARRAY DEVICES WITH INTERCONNECT LINES OF VARIOUS LENGTHS

BACKGROUND OF THE INVENTION

This invention relates to programmable logic array integrated circuit devices, and more particularly to improvements in the ways in which interconnect lines are provided in such devices.

Programmable logic array integrated circuits are well known as shown, for example, by such references as Pedersen et al. U.S. Pat. No. 5,260,610 and Cliff et al. U.S. Pat. No. 5,260,611. As is exemplified by these references, many recent programmable logic array devices have a large number of logic regions disposed in a two-dimensional array on the integrated circuit. Each logic region is capable of performing a relatively simple logic function, the particular logic function performed by each region being selected when the device is "programmed" prior to its use as a logic device. Interconnection conductors are provided on the device for (1) delivering to each logic region the signals on which that logic region will operate, and (2) conveying from each logic region the signals indicative of the logic performed by that logic region. These interconnection conductors can be used to convey output signals from one logic region to the inputs of other logic regions, thereby making it possible for the logic array device to perform much more complex logic functions than any individual logic region can perform. Just as the logic functions performed by the individual logic regions are programmable, many of the connections between interconnection conductors and between the logic regions and the interconnection conductors are also typically programmable so that the manner in which signals are routed through the interconnection conductors and the manner in which the logic regions are thereby interconnected is also programmable.

It is extremely difficult to design a programmable logic array device of the type described above which has just the right ratio of logic region resources to interconnection conductor resources. These devices are intended as general-purpose devices, and the designer of a device cannot know all of the many uses to which customers may wish to put the device. For example, some uses may require a high degree of interconnection between logic regions, while other uses may need much less interconnection. Even the type of interconnection needed by the user may vary. Some uses may involve functions with large fan out, requiring wide distribution of a logic region output to many other logic regions. Other uses may involve more incremental logic, never requiring that any logic region output go to more than a small number of other logic regions.

Certain early, relatively small programmable logic array integrated circuit devices could include completely or almost completely general interconnection circuit resources, even though only a fraction of such resources was ever actually employed in any use of those devices. Such completely general interconnectivity becomes increasingly wasteful and ultimately prohibitive as the amount of logic on the device increases. Thus it becomes increasingly important to devise less than completely general interconnection resources which nevertheless allow the device to satisfy the maximum number of possible uses.

The disincentives to provide completely general interconnection capability on more sophisticated programmable logic array devices is especially strong in the case of reprogrammable devices. This is so because reprogrammable interconnection elements tend to be larger and to have greater circuit loading and signal delay characteristics than one-time-only programmable interconnection elements. Thus in the design of reprogrammable devices there is even greater pressure to economize on the number of interconnection elements provided to hold down overall device size and to reduce circuit loading and signal propagation delay. While it may be feasible to provide fully populated or at least quite densely populated regions of interconnection capability in some one-time-only programmable devices (e.g., those shown, for example, in El Gamal et al., "An Architecture for Electrically Configurable Gate Arrays," IEEE Journal of Solid-State Circuits, Vol. 24, No. 2, April 1989, pp. 394–98; El-Ayat et al., "A CMOS Electrically Configurable Gate Array," IEEE Journal of Solid-State Circuits, Vol. 24, No. 3, June 1989, pp. 752–62; and Elgamal et al. U.S. Pat. 4,758,745), such high density interconnection populations tend to be much more disadvantageous in reprogrammable devices, especially as the amount of logic on the device increases.

One approach to providing interconnection circuitry that will meet a variety of needs is shown in Freeman U.S. patent Re. 34,363. In the Freeman system many short lengths of conductor are programmably interconnectable to route signals from one logic region to one or more other logic regions. A disadvantage of this approach is that each conductor interconnection tends to delay and attenuate the signal being transmitted. Because the numbers of conductor interconnections through which various signals may have to travel can vary significantly, maintaining synchronization and uniform level among several signals can be difficult and/or may limit the speed at which the device can be operated. The above-mentioned El Gamal, El-Ayat, and Elgamal references show other examples of circuits in which multiple short lengths of conductor are programmably "pieced together" to make required longer conductors.

Another approach to providing flexible interconnection circuitry is shown in the above-mentioned Pedersen et al. patent. In this system, the logic regions are grouped into "logic array blocks" of 16 logic regions each. Several interconnection conductors are associated with each logic array block for providing interconnection among the logic regions in the block. In addition, global horizontal and global vertical conductors extend respectively along rows and columns of logic array blocks. The global horizontal conductors provide interconnection among the blocks in each row. The global vertical conductors provide interconnection among the rows of blocks. Thus two levels of conductor extent are provided: (1) local conductors spanning the 16 logic regions in each logic array block, and (2) global conductors spanning either rows or columns of logic array blocks. While this is an improvement over the Freeman system in the respect that it is not necessary to patch together large numbers of short conductors to provide required long interconnections, it can be wasteful of interconnection resources. For example, making a connection between two adjacent logic regions in a logic block consumes a local conductor which is longer than the necessary connection. Similarly, connecting horizontally adjacent logic blocks consumes a global horizontal conductor, which again is much longer than the necessary connection.

More recent products of the assignee of the above-mentioned Freeman patent have added longer, uninterrupted conductors, and also uninterrupted conductors between adjacent logic regions (see, for example, Carter U.S. Pat. No. 4,642,487). However, these products still rely heavily on piecing together many relatively short interconnection conductors to make certain kinds of interconnections. The above-mentioned El-Ayat reference mentions (in the sentence bridging pages 752 and 753) the use of conductor segments of progressively increasing length. Again, however, this architecture relies on piecing these conductors together to make longer connections when necessary.

In view of the foregoing it is an object of this invention to provide improved interconnection circuitry for programmable logic array devices.

It is another object of this invention to provide interconnection circuitry for programmable logic array devices which neither requires connecting large numbers of short conductor segments together to make long-distance connections, nor which requires the use of long conductors to make relatively short connections.

SUMMARY OF THE INVENTION

These and other objects of the invention are accomplished in accordance with the principles of the invention by providing interconnection circuitry which includes bi-directional conductors of several different lengths. For example, some of these conductors may extend only between two adjacent logic regions. Other conductors may span four adjacent logic regions. Still other conductors may span eight adjacent logic regions. This progression may continue up to "global" conductors which span all the logic regions in a given row of logic regions or which span all the rows of logic regions. Providing several different lengths of interconnection conductors in this way greatly increases the user's ability to select for a given interconnection a conductor of very nearly the exact length required to make that interconnection. This reduces waste of interconnection resources, which helps reduce the amount of such resources that must be included in order to ensure that the device has the capability to provide a given amount of interconnectivity. Each conductor is continuous or substantially continuous along its length. In other words, none of these conductors is made by programmably interconnecting multiple, axially aligned and adjacent conductor segments. Similarly, the length of each conductor is fixed and not optionally extendable by programmably connecting it to another axially aligned and adjacent conductor.

Further features of the invention, its nature and various advantages will be more apparent from the accompanying drawings and the following detailed description of the preferred embodiments.

BRIEF DESCRIPTION OF THE DRAWINGS

FIG. 7 is a schematic block diagram showing representative portions of yet another aspect of the device shown in FIG. 1.

DETAILED DESCRIPTION OF THE PREFERRED EMBODIMENTS

Figure 1:
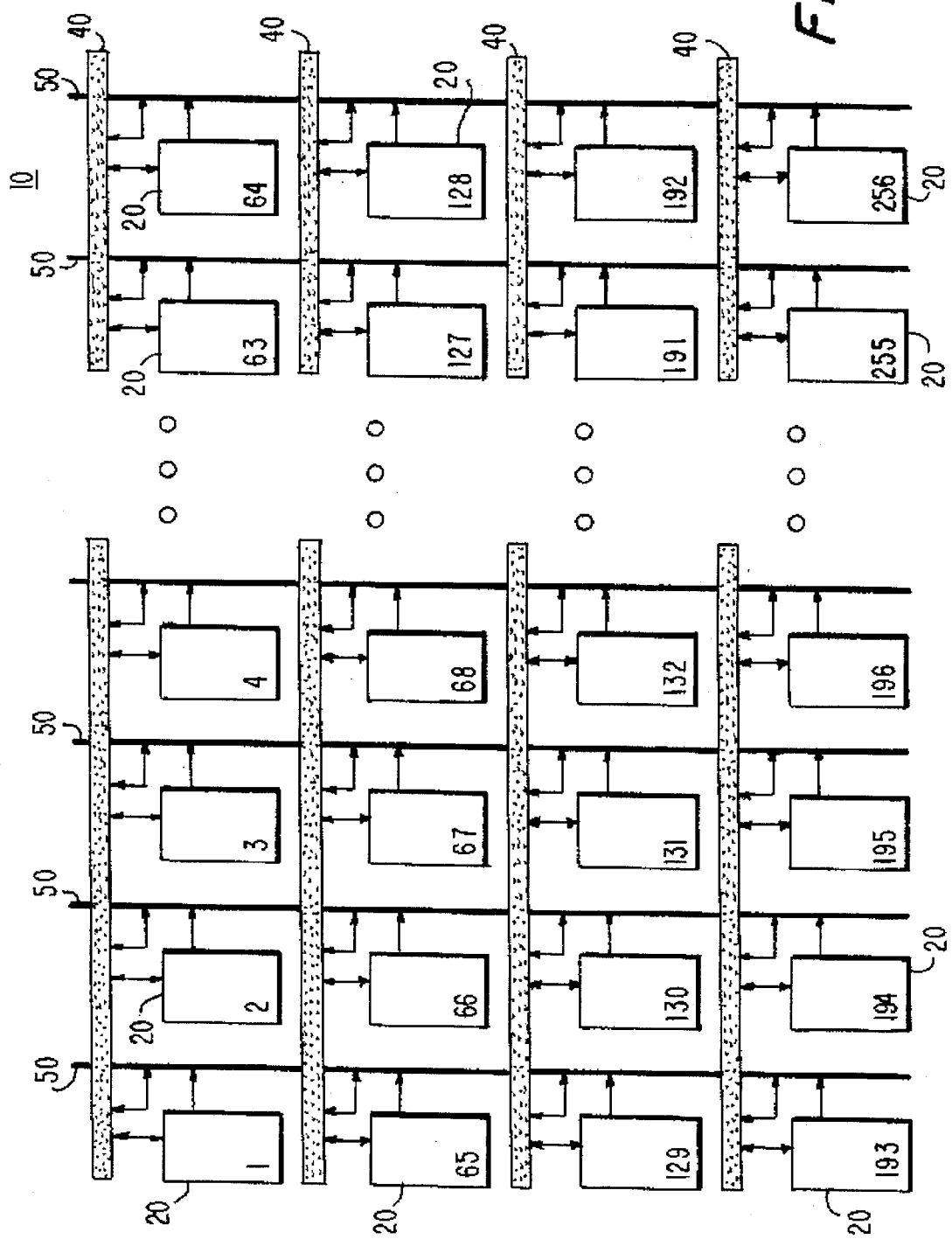
FIG. 1 is a simplified, partial, block diagram of an illustrative programmable logic array device constructed in accordance with the principles of this invention.

In the illustrative programmable logic array device 10 shown in FIG. 1, 256 logic regions 20 are disposed on the device in four rows of 64 logic regions each. Other numbers of logic regions having other arrangements on the device are of course possible.

Figure 2:
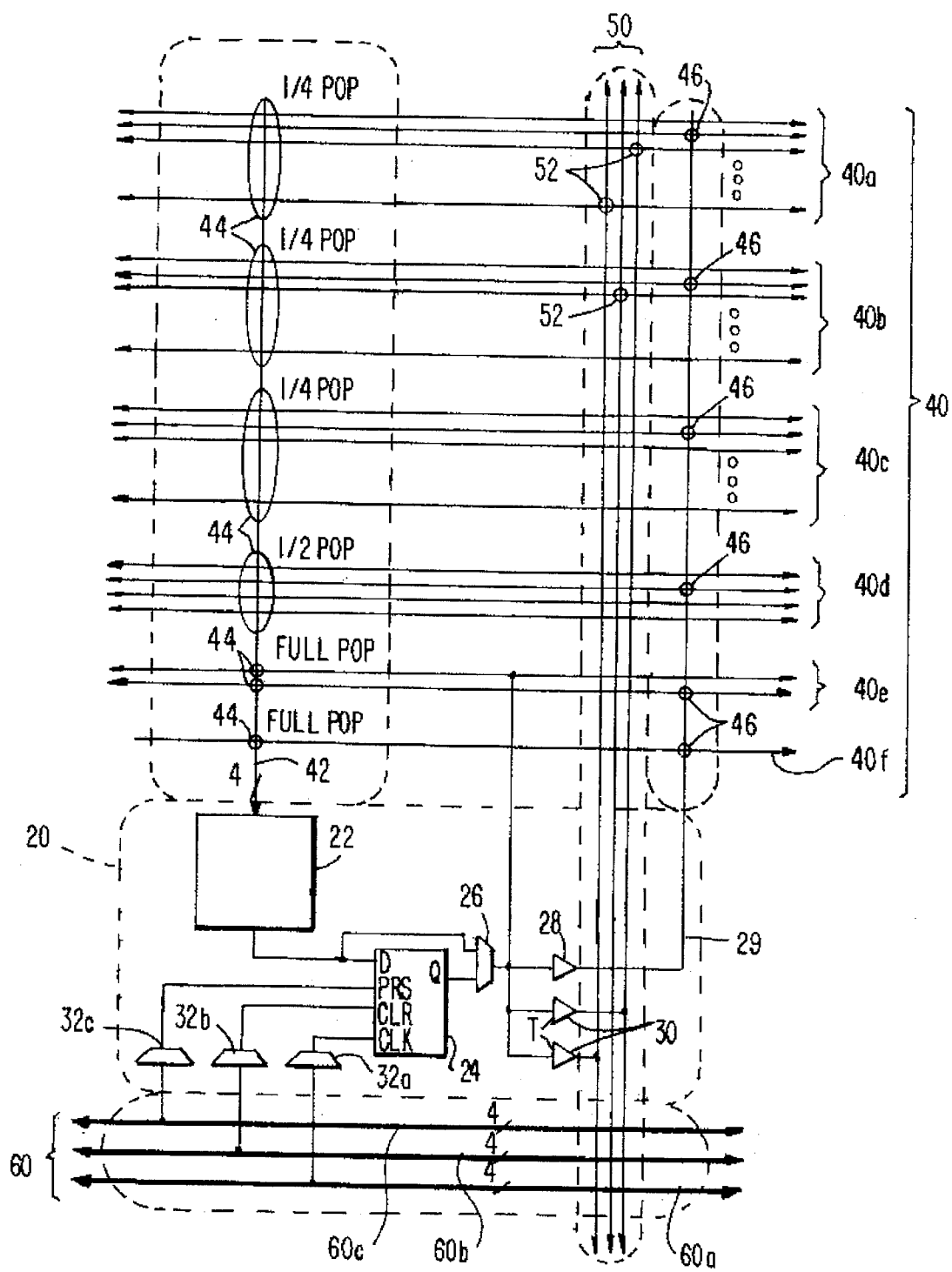
FIG. 2 is a schematic block diagram of a representative portion of the device shown in FIG. 1.

The construction of a representative logic region 20 is shown in more detail in FIG. 2. There it will be seen that each logic region includes a four-input universal logic block ("ULB") 22 (e.g., a four-input look-up table) which is programmable to produce as an output signal any logical function of its four-inputs 42. The output signal of ULB 22 is applied to the data input terminal D of flip-flop or register device 24, and also bypasses flip-flop 24 by being applied to one input of programmable logic connector ("PLC") 26 (a multiplexer in the presently preferred embodiment). The Q output of flip-flop 24 is applied to the other input terminal of PLC 26. PLC 26 is programmable to select as its output either of its inputs. Thus the output signal of logic region 20 can be either the direct or the registered output of ULB 22. The preset, clear, and clock inputs to flip-flop 24 will be discussed in more detail below, as will the manner in which the output of the logic region is selectively applied to as many as two global vertical conductors 50 and/or to any of several horizontal conductors 40.

The above-described construction of logic regions 20 is only illustrative, and those skilled in the art will appreciate that many other logic region constructions are possible. For example, logic regions 20 could alternatively be implemented as product-term-based macrocells. Similarly, PLC 26 (and other PLCs used throughout device 10) can be implemented in any of many different ways. For example, each PLC can be a relatively simple programmable connector such as a plurality of switches for connecting any one of several inputs to an output. Or each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. The components of PLCs can be controlled by various, programmable, function control elements ("FCEs"), which are not separately shown in the drawings. (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. Any of these various technologies can also be used for the programmable memories of ULBs 22. Thus it will be seen that this invention is applicable to both reprogrammable and one-time-only programmable devices. However, the invention is especially advantageous in the case of reprogrammable devices because (as noted in the background section of this specification) those devices tend to benefit more from economies in interconnection resources. Thus the most preferred embodiments of this invention are reprogrammable.

FIG. 1 shows that each row of logic regions 20 has an associated group of horizontal interconnection conductors 40. FIG. 1 also shows that each column of logic regions has an associated group of vertical conductors 50. All of conductors 40 and 50 are bi-directional in the sense that each conductor or portion of a conductor can convey a signal in either direction along the conductor or conductor portion. FIGS. 1 and 2 show that the four inputs to each logic region ULB 22 come from the horizontal conductors associated with that logic region.

Figure 3:
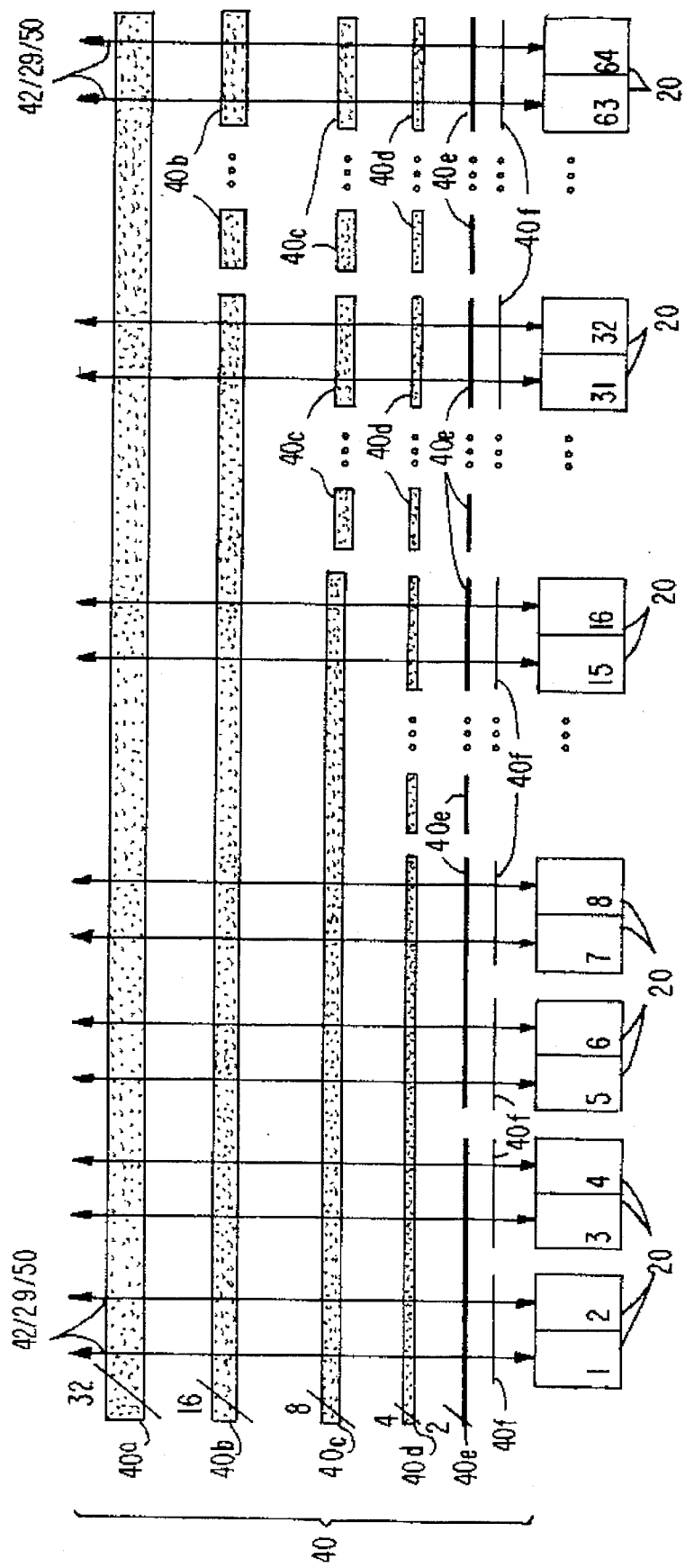
FIG. 3 is a simplified, partial, block diagram showing a particular aspect of a representative portion of FIG. 1 in somewhat more detail.

FIG. 3 shows how the conductors in a representative horizontal conductor group 40 are configured. In this particular embodiment there are 32 horizontal conductors 40a which extend continuously or substantially continuously along the entire length of the associated row of 64 logic regions 20. Conductors 40a may therefore be referred to as "global" horizontal conductors.

Also included in representative group 40 are 32 conductors 40b divided into two subgroups of 16 conductors each. Each of these subgroups of conductors 40b extends continuously or substantially continuously along a respective one of two horizontally adjacent groups of 32 adjacent logic regions 20. In other words, there are 16 conductors 40b which extend along the 32 left-most logic regions 20 in FIG. 3, and there are 16 other conductors 40b which extend along the 32 right-most logic regions 20 in FIG. 3. Conductors 40b associated with the left half of the device are not directly connectable to axially aligned conductors 40b associated with the right half of the device via programmable connections. In other words, there are no such programmable connections between the left and right half conductors 40b. This characteristic of these (and other similarly characterized conductors) will sometimes be referred to herein by saying that these conductors are "separate" from one another.

The next subgroups of horizontal conductors in representative group 40 are conductors 40c. There are four subgroups of conductors 40c, each subgroup including eight conductors. The conductors in each of these subgroups extend continuously or substantially continuously along a respective one of four horizontally adjacent groups of 16 logic regions 20. Thus, for example, the eight conductors 40c in the left-most subgroup of these conductors extend along the left-most 16 logic regions 20 (numbered 1–16 in FIG. 3). The eight conductors 40c in the next to left-most subgroup of these conductors extend along the logic regions numbered 17–32 in FIG. 3. The right-most and next to right-most subgroups of conductors 40c similarly extend along two more different groups of 16 logic regions. As in the case of conductors 40b, all of conductors 40c are separate from one another, as the term "separate" is defined herein. No circuitry is provided for optionally directly connecting axially aligned and adjacent conductors 40c to make longer conductors.

The next subgroups of horizontal conductors in representative group 40 are conductors 40d. There are eight subgroups of conductors 40d, each subgroup including four conductors and extending continuously or substantially continuously along a respective one of eight horizontally adjacent groups of eight logic regions 20. For example, the left-most group of eight conductors 40d extends along logic regions 1–8, the next to left-most group of eight conductors 40d extends along logic regions 9–16, the next rightward group of eight conductors 40d extends along logic regions 17–24, and so on across the depicted row. Again, all of conductors 40d are separate from one another, as the term "separate" is defined above. Thus no circuitry is provided for optionally connecting axially aligned and adjacent conductors 40d to make longer conductors.

The next subgroups of conductors in group 40 are conductors 40e. There are 16 subgroups of conductors 40e, each subgroup including two conductors and extending continuously or substantially continuously along a respective one of 16 horizontally adjacent groups of four logic regions 20. For example, the left-most group of four conductors 40e extends along logic regions 1–4, the next to left-most group of four conductors 40e extends along logic regions 5–8, and so on across the depicted row. As in the case of other conductors 40, each of conductors 40e is separate from all other conductors 40e, as the term "separate" has been defined herein. No circuitry is provided for optionally directly interconnecting axially aligned and adjacent conductors 40e.

The last subgroups of conductors in group 40 are conductors 40f. There are 32 subgroups of conductors 40f, each subgroup including one conductor and extending along a respective one of 32 horizontally adjacent pairs of logic regions. For example, the left-most conductor 40f spans logic regions 1 and 2, the next to left-most conductor 40f spans logic regions 3 and 4, and so on across the depicted row. Conductors 40f are again separate from one another as that term has been defined herein.

The provision of horizontal conductors of many different lengths as described above makes it generally possible to make interconnections between horizontally aligned logic regions using conductors that are close to the appropriate length for making that connection. For example, if it were desired to connect the output of logic region 3 to the input of logic region 4 in FIG. 3, the conductor 40f spanning these two logic regions would typically be used for that purpose. If it were desired to connect the output of logic region 6 to the inputs of logic regions 5, 7, and 8, one of the conductors in the next-to-left-most subgroups 40e would typically be used. In general, the shortest possible conductor is used to make each required interconnection. Longer conductors are used for the longer interconnections and for the interconnections with greater fan out. In order to ensure the presence of adequate interconnection resources of each length without having to provide circuitry for optionally interconnecting axially aligned conductors 40 as in some prior art devices, the number of conductors 40 of each length adjacent to each logic region 20 increases with increasing conductor length. Thus in the particular embodiment shown in the drawings the conductors 40 adjacent to each logic region 20 include one conductor 40f which spans two regions 20, two conductors 40e which span four regions 20, four conductors 40d which span eight regions 20, eight conductors 40c which span 16 regions 20, 16 conductors 40b which span 32 regions 20, and 32 conductors 40a which span 64 regions 20. These progressions may be different both in terms of numbers of logic regions spanned and numbers of conductors spanning those regions, but in general, as the number of regions spanned increases, the number of conductors provided for spanning those regions also preferably increases.

Figure 5:
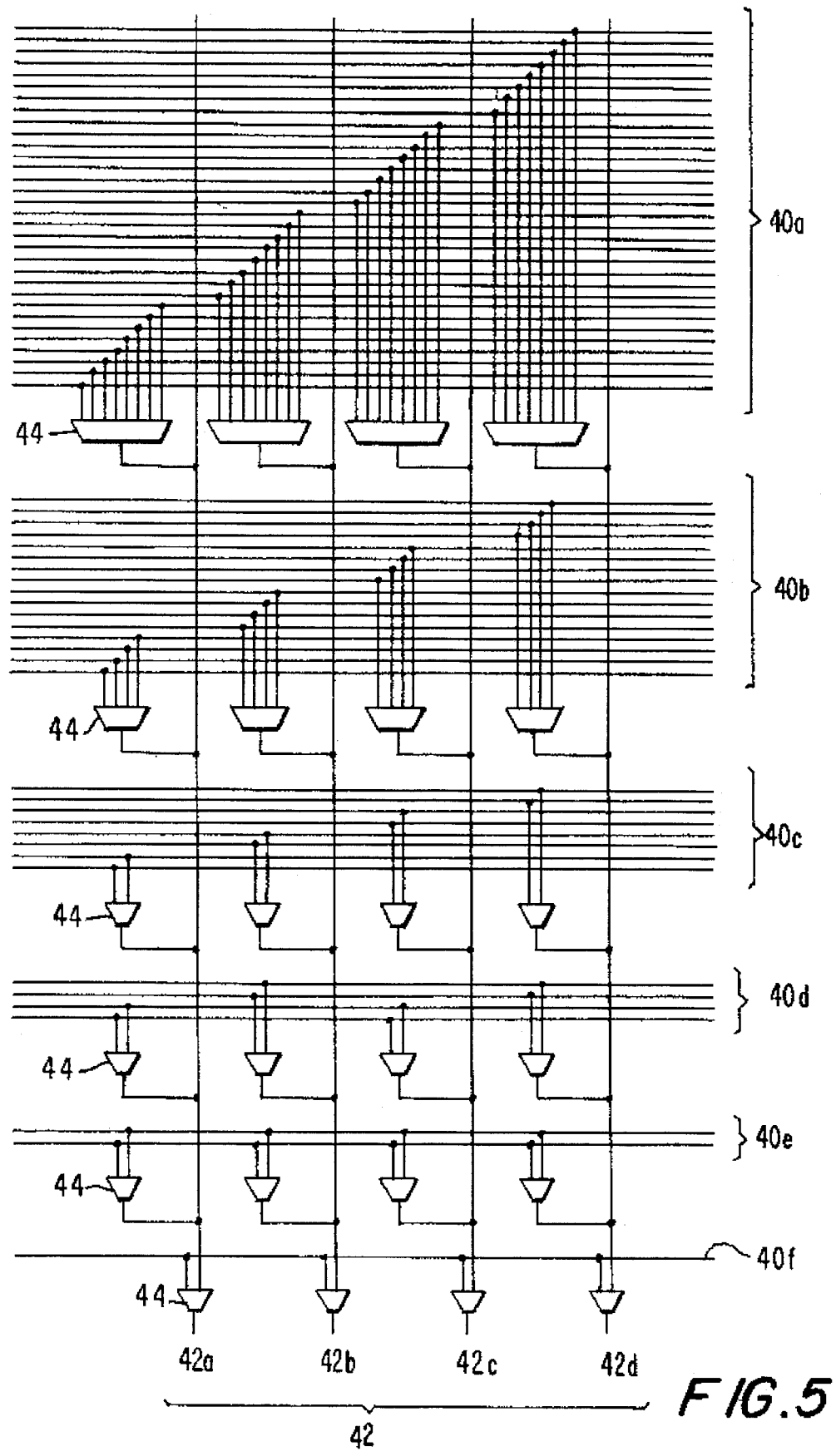
FIG. 5 is a more detailed logical diagram of a portion of FIG. 2.

FIG. 2 shows how the horizontal conductors 40 feed representative logic region 20, and also how the logic region feeds the horizontal and vertical conductors 40 and 50. Each of the four input lines 42 to the ULB 22 in logic region 20 is fed by a PLC 44 which receives inputs from one quarter of each of the associated horizontal conductors 40*a*, 40*b*, and 40*c*, as well as half of the associated conductors 40*d*, and all of the associated conductors 40*e* and 40*f*. (It should be noted here that the four inputs to ULB 22 are preferably fully permutable.) The preferred distribution of inputs to PLCs 44 is shown in more detail in logical terms in FIG. 5. There it will be seen that one quarter of conductors 40*a* are connectable to conductor 42*a*, a second different quarter of conductors 40*a* are connectable to conductor 42*b*, a third different quarter of conductors 40*a* are connectable to conductor 42*c*, and a fourth different quarter of conductors 40*a* are connectable to conductor 42*d*. Similarly, different quarters of conductors 40*b* are respectively connectable to conductors 42*a*–*d*, and different quarters of conductors 40*c* are also respectively connectable to conductors 42*a*–*d*. One half of conductors 40*d* are connectable to conductors 42*a* and 42*c*, and a second different half of conductors 40*d* are connectable to conductors 42*b* and 42*d*. All of the conductors 40*e* and 40*f* are connectable to all of conductors 42. In FIG. 2 the above-described PLC input connections are indicated by circles or ellipses 44 with adjacent lettering to indicate whether the connection regions are fully populated ("full pop"), 50% populated ("½ pop"), or 25% populated ("¼ pop"). Each PLC 44 is of course programmable to connect one of its inputs to its output (i.e., the associated input to ULB 22).

As is also shown in FIG. 2, the output of representative logic region 20 can be applied (via driver 28 and lead 29) to the associated horizontal conductor 40*f*, and/or to one of each of associated conductors 40*e*, 40*d*, 40*c*, 40*b*, and/or 40*a*. Each of these possible output connections (indicated by the circles 46 in FIG. 2) is programmable to make or not make the depicted connection. Along a horizontal row the output connections 46 of the logic regions are distributed so that each horizontal conductor of a given length has the same number of possible points at which it can receive a logic region output signal. For example, each of the 32 global horizontal conductors 40*a* can receive an input from either of two of the 64 logic regions 20 along the associated row of regions 20. Similarly, each of the 16 horizontal conductors 40*b* can receive an input from either of two of the 32 logic regions 20 spanned by that conductor 40*b*. Each of conductors 40*c*, 40*d*, 40*e*, and 40*f* also has two possible inputs.

From the preceding paragraph it will be seen that the output of each logic region 20 can be connected to a horizontal conductor 40 of any of the available lengths. This allows the user of the device to select a horizontal conductor length for each logic region output that is appropriate for the distance that the output must travel and/or for the degree of fan out required for that output. This again contributes to economical use of interconnection conductor resources.

FIG. 2 also shows that each logic region 20 has two programmably tri-statable output drivers 30 for selectively applying the output of the logic region to each of two of the three adjacent global vertical conductors or signal leads 50. These inputs to each group of three conductors 50 are distributed so that each conductor 50 has approximately the same number of possible inputs when all the rows of the device are considered. Each conductor 50 extends continuously or substantially continuously along the entire length of the associated column.

In each row each global vertical conductor 50 is programmably connectable to one of conductors 40*a* or 40*b* via bi-directional connections 52. These connections allow conductors 50 to be used to transmit signals from one row of logic regions 20 to another row.

Figure 6:
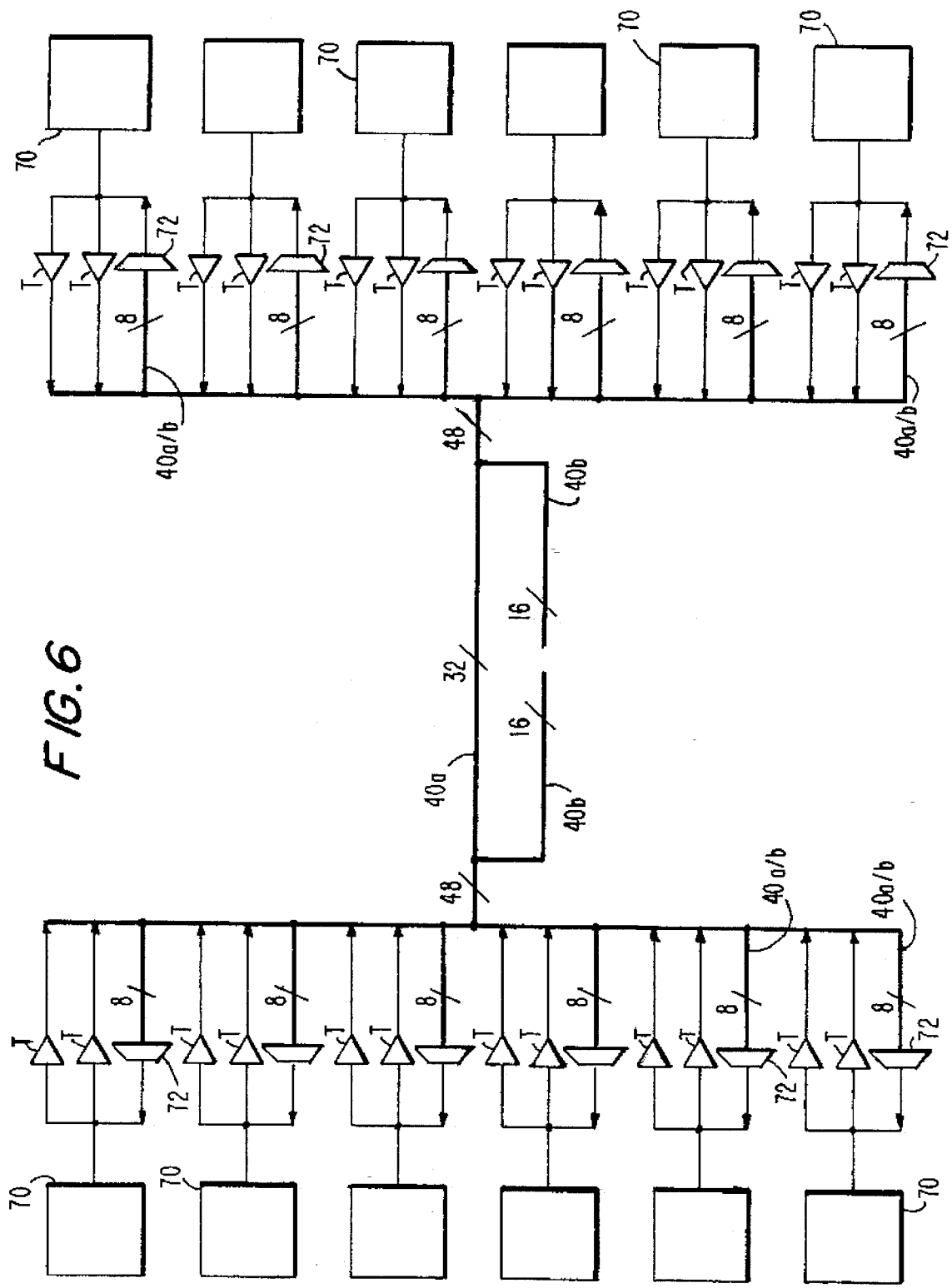
FIG. 6 is a schematic block diagram showing a representative portion of still another aspect of the device shown in FIG. 1.

Communication to and from left and right side input/output pads associated with device 10 is illustrated by FIG. 6, which shows the input/output pads and connections for one illustrative row of the device. Each row interfaces with 12 input/output pads 70 at the left and right of the chip. The 48 conductors 40*a* and 40*b* adjacent to each side of the chip are divided into six groups 40*a*/*b* of eight conductors at each end of the row. Each group of eight conductors 40*a*/*b* drives a PLC 72 (an 8 to 1 multiplexer in the presently preferred embodiment), the output of which drives a respective one of pads 70. Each pad 70 drives two programmable tri-state buffers 74, which in turn respectively drive two of the conductors in the group 40*a*/*b* associated with that pad.

FIG. 7 illustrates how conductors 50 interface with input/output pads 80 at the top and bottom of the chip. In general, at both the top and bottom of the chip three groups of conductors 50 are grouped together and drive into a PLC 82 (a 9 to 1 multiplexer in the presently preferred embodiment), the output of which drives a pad 80. Each top or bottom pad 80 drives a TTL buffer 84, which in turn drives a PLC 86 (a 1 to 9 demultiplexer in the presently preferred embodiment). The outputs of each PLC 86 drive any of the nine conductors 50 associated with the pad 80 which is the source of the PLC 86 output signal. This allows the pad to drive any of these nine conductors 50. The last (right-most) conductors 50 do not have any other groups of conductors 50 to pair with. These conductors 50 can therefore drive input/output pads 80 through a three-input PLC 82, and these pads can drive any of these three conductors through TTL buffers 84 and three-output PLC 86.

Figure 4:
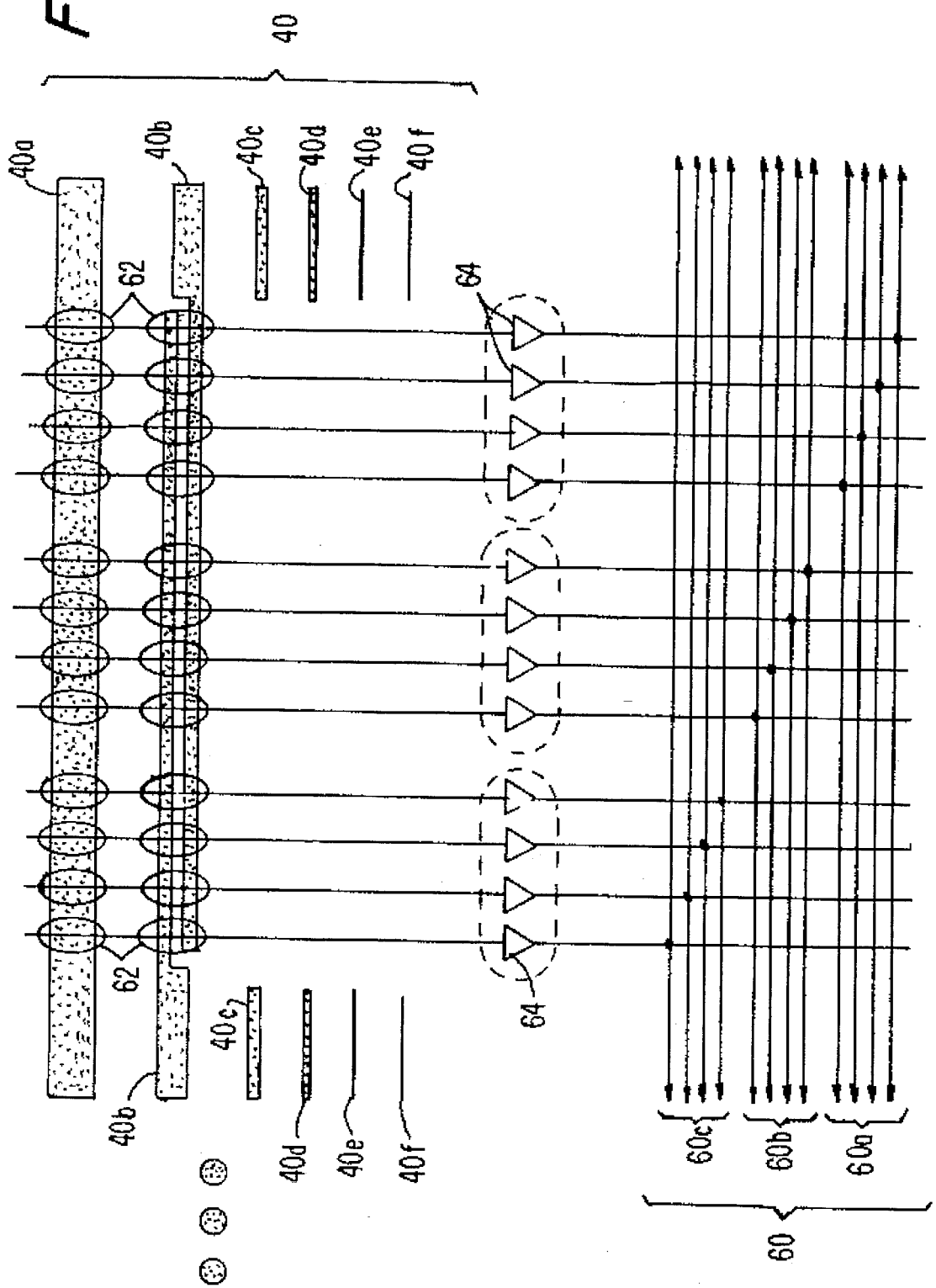
FIG. 4 is a schematic block diagram showing a representative portion of another aspect of the device shown in FIG. 1.

Each row of logic regions 20 is served by four clock conductors 60*a*, four clear conductors 60*b*, and four preset conductors 60*c* (see FIGS. 2 and 4). Each logic region 20 includes a PLC 32*a* for programmably selecting one of the four adjacent clock signal conductors 60*a* as the source of the clock signal for the flip-flop 24 in that logic region. Similarly, each logic region 20 includes a PLC 32*b* for programmably selecting one of the four adjacent clear signal conductors 60*b* as the source of the clear signal for flip-flop 24. Each logic region 20 also includes a PLC 32*c* for programmably selecting one of the four adjacent preset signal conductors as the source of the preset signal for flip-flop 24. PLCs 32 are multiplexers in the presently preferred embodiment.

Generation of the clock, clear, and preset signals for each row is shown in FIG. 4. At the center of each row of logic regions 20 and associated horizontal conductors 40, each clock conductor 60*a* is driven by a PLC 62 (a multiplexer in the presently preferred embodiment) whose inputs are one quarter of the global horizontal conductors 40*a* associated with that row and one quarter of half of each of the two groups of horizontal conductors 40*b* associated with that row. The output of each of these PLCs 62 is applied to the associated conductor 60*a* via an associated buffer 64. The input connections to the four PLCs 62 that serve the four clock conductors 60*a* are distributed evenly over conductors 40*a* and also over the 50% of conductors 40*b* that are extended for connection to these PLCs. Each of clear conductors 60*b* and preset conductors 60*c* is similarly connectable to the horizontal conductors 40*a* and 40*b* mentioned above.

It will be understood that the foregoing is only illustrative of the principles of the invention, and that various modifications can be made by those skilled in the art without departing from the scope and spirit of the invention. For example, the number of logic regions in each row, the number of rows of logic regions, the lengths of the various conductors, and the numbers of conductors of each length can be adjusted as desired. The degree of connectivity between the various types of conductors and the type of logic employed in each logic region are other examples of properties of the logic array device that can be varied.

The invention claimed is:

1. A programmable logic array device comprising:

a plurality of regions of programmable logic, each of said regions producing an output signal which is a programmable function of a plurality of input signals applied to that region;

a plurality of conductors adjacent to each of said regions for selectively conveying signals between said regions, said conductors adjacent to each of said regions being grouped into at least three groups, the conductors in each group extending substantially continuously to an associated number of other regions, said number of other regions being different for each of said three groups, each of said groups having an associated number of said conductors, said number of said conductors in each of said groups increasing as the number of other regions to which the conductors in that group extend increases; and connectors for programmably selectively connecting conductors adjacent to each of said regions to said input and output signals of said region.

2. The apparatus defined in claim 1 wherein said conductors in said three groups are all substantially parallel to one another.

3. The apparatus defined in claim 1 wherein said connectors for each of said regions include:

a plurality of input connectors for programmably selectively connecting conductors adjacent to said region to said input signals of said region; and an output connector for programmably selectively connecting said output signal of said region to conductors adjacent to said region.

4. The apparatus defined in claim 3 wherein each of said input connectors of each of said regions is programmably selectively connectable to at least one conductor in each of said groups adjacent to said region.

5. The apparatus defined in claim 4 wherein said input connectors of each of said regions are collectively selectively programmably connectable to substantially all of said conductors in each of said groups adjacent to said region.

6. The apparatus defined in claim 3 wherein said output connector of each of said regions is programmably selectively connectable to at least one conductor in each of said groups adjacent to said region.

7. The apparatus defined in claim 1 wherein said regions and said conductors are disposed in a row on said logic array device, and wherein said row is one of a plurality of substantially similarly constituted rows on said device.

8. The apparatus defined in claim 7 wherein from row to row said regions are disposed on said device in a plurality of columns that are oriented substantially perpendicular to said rows.

9. The apparatus defined in claim 8 further comprising:

a plurality of signal leads extending between said rows adjacent to each of said columns; and a plurality of programmable connections associated with each of said regions for selectively connecting signal leads adjacent to said region to said output signal of said region and to conductors adjacent to said region.

10. The apparatus defined in claim 9 wherein said programmable connections that selectively connect said signal leads to said conductors are bi-directional.

11. The apparatus defined in claim 1 wherein one of said groups adjacent to each of said regions includes a conductor which extends only to one other region which is adjacent to said region.

12. The apparatus defined in claim 11 wherein said regions are disposed on said device in a row, and wherein a second of said groups adjacent to each of said regions includes conductors which extend to substantially all other regions in said row.

13. The apparatus defined in claim 12 wherein a third of said groups adjacent to each of said regions includes conductors which extend to more than one other region but to substantially less than all other regions in said row.

14. The apparatus defined in claim 1 wherein said conductors adjacent to each of said regions are grouped into at least four groups, the conductors in each group extending to an associated number of other regions, said number being different for each of said four groups.

15. The apparatus defined in claim 1 wherein each conductor in at least two of said groups adjacent to each of said regions is axially aligned with another conductor which is not in any of said groups adjacent to said region but which is in one of said groups adjacent to another of said regions, said axially aligned conductors being separate from one another.

16. A programmable logic array device comprising:

a plurality of regions of programmable logic disposed on said device in a row, each of said regions having a plurality of input terminals for receiving input signals and at least one output terminal for outputting an output signal which is determined by the programmable logic of that region and the input signals received by that region;

at least three groups of conductors adjacent to each of said regions, each of said groups of conductors extending substantially continuously adjacent to a different number of others of said regions, each of said groups adjacent to a region including an associated number of conductors, the number of conductors in each of said groups increasing as the number of other regions to which the conductors in that group extend increases;

input connectors associated with each input terminal of each of said regions for programmably selectively connecting said input terminal to at least one of the conductors in each of the three groups that are adjacent to that region; and output connectors associated with the output terminal of each of said regions for programmably selectively connecting said output terminal to at least one of the conductors in each of the three groups that are adjacent to that region.

17. The apparatus defined in claim 16 wherein said conductors in each of said three groups adjacent to each of said regions in said row are substantially parallel to one another and to said row.

18. The apparatus defined in claim 16 wherein said input connectors associated with each of said regions are collectively capable of connecting substantially any conductor in each of the three groups that are adjacent to said region to an input terminal of said region.

19. The apparatus defined in claim 16 wherein said row is one of a plurality of substantially similarly constituted rows disposed parallel to one another on said device, each of said rows including associated conductors, input connectors, and output connectors constituted similarly to the conductors, input connectors, and output connectors that are associated with said row.

20. The apparatus defined in claim 19 wherein from row to row said regions are disposed on said device in a plurality of columns that are oriented substantially perpendicular to said rows.

21. The apparatus defined in claim 20 further comprising:
- a plurality of signal leads extending between said rows adjacent to each of said columns; and
- a plurality of programmable connections associated with each of said regions for selectively connecting signal leads adjacent to said region to said output terminal of said region and to conductors adjacent to said region.

22. The apparatus defined in claim 21 wherein said programmable connections that selectively connect said signal leads to said conductors are bi-directional.

23. The apparatus defined in claim 16 wherein one of said groups adjacent to each of said regions includes a conductor which extends only to one other region which is adjacent to said region.

24. The apparatus defined in claim 23 wherein a second of said groups adjacent to each of said regions includes conductors which extend to substantially all other regions in said row.

25. The apparatus defined in claim 24 wherein a third of said groups adjacent to each of said regions includes conductors which extend to more than one other region but to substantially less than all other regions in said row.

26. The apparatus defined in claim 16 further comprising:
- a fourth group of conductors adjacent to each of said regions, said fourth group of conductors extending to a different number of others of said regions than any of said other groups.

* * * * *